United States Patent [19]
Mogi

[11] Patent Number: 5,907,590
[45] Date of Patent: May 25, 1999

[54] FREQUENCY DIVIDING CIRCUIT, FREQUENCY DIVIDING METHOD AND TELEPHONE TERMINAL DEVICE INCORPORATING THE FREQUENCY DIVIDING CIRCUIT

[75] Inventor: Yoshiaki Mogi, Kanagawa, Japan

[73] Assignee: Sony Corporation, Tokyo, Japan

[21] Appl. No.: 08/795,559

[22] Filed: Feb. 6, 1997

[30] Foreign Application Priority Data

Feb. 15, 1996 [JP] Japan .................................. 8-028218

[51] Int. Cl.[6] .................................................. H03K 21/00
[52] U.S. Cl. .......................... 377/48; 455/73; 455/550; 455/575
[58] Field of Search ........................... 377/48; 327/115, 327/117; 364/703; 455/73, 550, 575

[56] References Cited

U.S. PATENT DOCUMENTS 5,295,173  3/1994  Takada et al. .......................... 377/48
5,442,774  8/1995  Pickup et al. .......................... 377/48

FOREIGN PATENT DOCUMENTS 2239115  6/1991  United Kingdom .................... 377/48

*Primary Examiner*—Margaret Rose Wambach
*Attorney, Agent, or Firm*—Jay H. Maioli

[57] ABSTRACT

A frequency dividing circuit, which is easy to form as an IC and which offers reduction both in size and power consumption, has a register "a" for storing the difference between the denominator and the numerator of the fractional frequency dividing ratio, another register "b" for storing the numerator of the fractional frequency dividing ratio, a selector for selecting one of the registers and connecting the selected register to a computing unit, a flip-flop for picking up the output from the computing unit in timing with the signal to be frequency-divided, a comparator for comparing the value stored in the register "a" and the value held by the flip-flop, and a logical circuit for computing AND of the output from the comparator and the signal to be frequency-divided.

14 Claims, 6 Drawing Sheets

5,907,590

1

FREQUENCY DIVIDING CIRCUIT, FREQUENCY DIVIDING METHOD AND TELEPHONE TERMINAL DEVICE INCORPORATING THE FREQUENCY DIVIDING CIRCUIT

BACKGROUND OF THE INVENTION

1. Field of the Invention

The present invention generally relates to a frequency dividing circuit and, more particularly, to a frequency dividing circuit having a frequency dividing ratio which is a rational number smaller than 1. The present invention is also concerned with a frequency dividing method and a telephone terminal device which employ the frequency dividing circuit.

2. Description of the Related Art

A conventional frequency dividing circuit having a fractional frequency dividing ratio, i.e., a rational number smaller than 1, incorporates an oscillating circuit. Such an oscillating circuit employs a PLL (Phase Lock Loop) which uses, as a comparative frequency, the frequency obtained by dividing a base clock frequency by the denominator of the frequency dividing ratio. Known also is a frequency dividing circuit having a counter for receiving a base clock signal and a logical circuit or a storage device which receives the output from the counter so as to select the clock pulses to be delivered from among the base clock pulses.

A description will be given of the conventional frequency dividing circuit which employs PLL, with specific reference to FIG. 6. The circuit shown in FIG. 6 is designed to produce, upon receipt of input pulses of a frequency $f_0$, output pulses at a fractional frequency dividing ratio of $N_2/N_1$. The circuit has the following components: a counter 41 which divides the input frequency $f_0$ by the denominator $N_1$ of the frequency dividing ratio, i.e., multiplies the same by $1/N_1$, to determine the quotient $f_0/N_1$; a phase comparator 42 which performs phase comparison by using the quotient $f_0/N_1$ as the comparative frequency; a low-pass filter (LPF) which passes the output from the phase comparator 42; a voltage-controlled oscillator (VCO) which oscillates at a frequency corresponding to the output voltage derived from the LPF 43; and a counter 45 which divides the output oscillation pulses of the VCO 44 by the numerator $N_2$ of the frequency dividing ratio.

Representing the oscillation frequency of the VCO 44 by $f_1$, the quotient $f_1/N_2$ produced by the counter 45 is delivered to the phase comparator 42 which performs phase comparison between the quotient $f_1/N_2$ and the quotient $f_0/N_1$ and produces a voltage corresponding to the phase differential. This voltage is delivered to the VCO 44, so that the VCO oscillates at a frequency corresponding to this voltage. In this system, the two inputs which are input to the phase comparator 42 are made to progressively converge into two signals which have an equal frequency with a constant phase differential therebetween. Consequently, the condition of $f_0/N_1 = f_1/N_2$ is established to provide the output frequency $f_1$ which is given by $f_1 = f_0 N_2/N_1$, whereby clock pulses of the frequency $f_1$, which is the result of frequency-division at the fractional frequency-dividing ratio of $N_2/N_1$, is obtained at the output terminal of the VCO 44.

This frequency dividing circuit, which incorporates the oscillation circuit employing PLL, has to deal with an analog voltage corresponding to the phase differential, so that the whole circuit inevitably incorporates both analog and digital circuits, making it difficult to construct the whole circuit in the form of an integrated circuit (IC). As a consequence, the

2 scale of the circuit is enlarged and the power consumption is increased. Another problem is that a comparatively long time is required until the clock frequency is stabilized, due to characteristics of the automatic control.

The later-mentioned type of frequency dividing circuit, which relies on the combination of a counter with a logical circuit or a storage device, can be constructed purely digitally and, hence, contributes to miniaturization of the circuit through circuit integration and also to reduction in power consumption. This type of frequency dividing circuit, however, is still unsatisfactory in that it cannot fully meet the requirements of performance posed by current electronic devices.

SUMMARY OF THE INVENTION

Accordingly, it is an object of the present invention to provide a frequency dividing circuit having a fractional frequency dividing ratio, which can be constructed fully digitally without relying upon analog PLL technique and without using any counter and storage device, and, hence, can easily be formed as an IC, thus contributing to a further reduction in the size and power consumption.

To this end, according to one aspect of the present invention, there is provided a frequency dividing circuit for effecting frequency division on a base signal at a fractional frequency dividing ratio, comprising: a base signal input through which the base signal is input; a memory device operative in synchronization with the base signal to store the value of the input base signal; a first register for storing the value of the numerator of the fractional frequency dividing ratio; a second register for storing the difference between the values of the denominator and the numerator of the fractional frequency dividing ratio; comparator means for comparing the output from the memory device and the value stored in the second register; switching means for selecting one of the first and second registers in accordance with the output from the comparator means and for outputting the output of the selected register; computing means for performing, upon receiving the output from the switching means and the output from the memory device, an adding operation or a subtracting operation to determine the sum of or difference between the received outputs in accordance with the output from the comparator means, and for delivering an output to the memory device; and a logical circuit for receiving the base signal and the inverse of the output from the comparator means thereby producing the frequency-divided output.

According to another aspect of the present invention, there is provided a telephone terminal device, comprising: a receiving system including, at least, a receiving digital processing section which performs A/D conversion of the received band signal and D/A conversion into an output voice signal; a transmitting system including, at least, a transmitting digital processing section which performs A/D conversion from an input signal and D/A conversion into transmission base band signal; and frequency dividing means for conducting frequency division of a base signal frequency at a fractional frequency dividing ratio into an integral submultiple of the base signal frequency thereby producing a clock frequency to be used in at least one of the digital processing section, the frequency dividing means comprising: a base signal input through which the base signal is input; a memory device operative in synchronization with the base signal to store the value of the input base signal; a first register for storing the value of the numerator of the fractional frequency dividing ratio; a second register for storing the difference between the values of the denominator and the numerator of the fractional frequency dividing ratio; comparator means for comparing the output from the memory device and the value stored in the second register; switching means for selecting one of the first and second registers in accordance with the output from the comparator means and for outputting the output of the selected register; computing means for performing, upon receiving the output from the switching means and the output from the memory device, an adding operation or a subtracting operation to determine the sum of or difference between the received outputs in accordance with the output from the comparator means, and for delivering an output to the memory device; and a logical circuit for receiving the base signal and the inverse of the output from the comparator means thereby producing the frequency-divided output.

According to still another aspect of the present invention, there is provided a frequency dividing method for effecting frequency division on a base signal at a fractional frequency dividing ratio, comprising the steps of: inputting a base signal through a base signal input; storing in a memory device the value of the input base signal in synchronization with the base signal; storing in a first register the value of the numerator of the fractional frequency dividing ratio; storing in a second register the difference between the values of the denominator and the numerator of the fractional frequency dividing ratio; comparing, by a comparator means, the output from the memory device and the value stored in the second register; selecting, by a switching means, one of the first and second registers in accordance with the result of the comparison and outputting the output of the selected register; performing, upon receiving the output from the switching means and the output from the memory device, an adding operation or a subtracting operation to determine the sum of or difference between the received outputs in accordance with the output from the comparator means, and for delivering the result of the adding or subtracting operation as an output to the memory device; and conducting, by a logical circuit, a logical computation on the base signal and the inverse of the output from the comparator means, thereby producing the frequency-divided output.

Preferably, the frequency dividing circuit of the present invention has a control circuit for changing the contents of the first and second registers.

The frequency dividing circuit of the present invention can be constructed by using only digital circuits, without using any PLL or other analog circuit. The frequency dividing circuit is therefore easy to form as an IC and, hence, can have a small size. The scale of the circuit also can be reduced as compared with the known circuit of the type which employs a counter and a logical circuit or a storage device. Consequently, the frequency dividing circuit, when formed as an IC chip, occupies only a small chip area when packaged in an electronic device and enables such an electronic device with reduced electric power.

The above and other objects, features and advantages of the present invention will become clear from the following description of the preferred embodiments when the same is read in conjunction with the accompanying drawings.

DESCRIPTION OF THE PREFERRED EMBODIMENTS

Embodiments of the frequency dividing circuit of the present invention will be described with reference to FIGS. 1 to 5.

Figure 1:
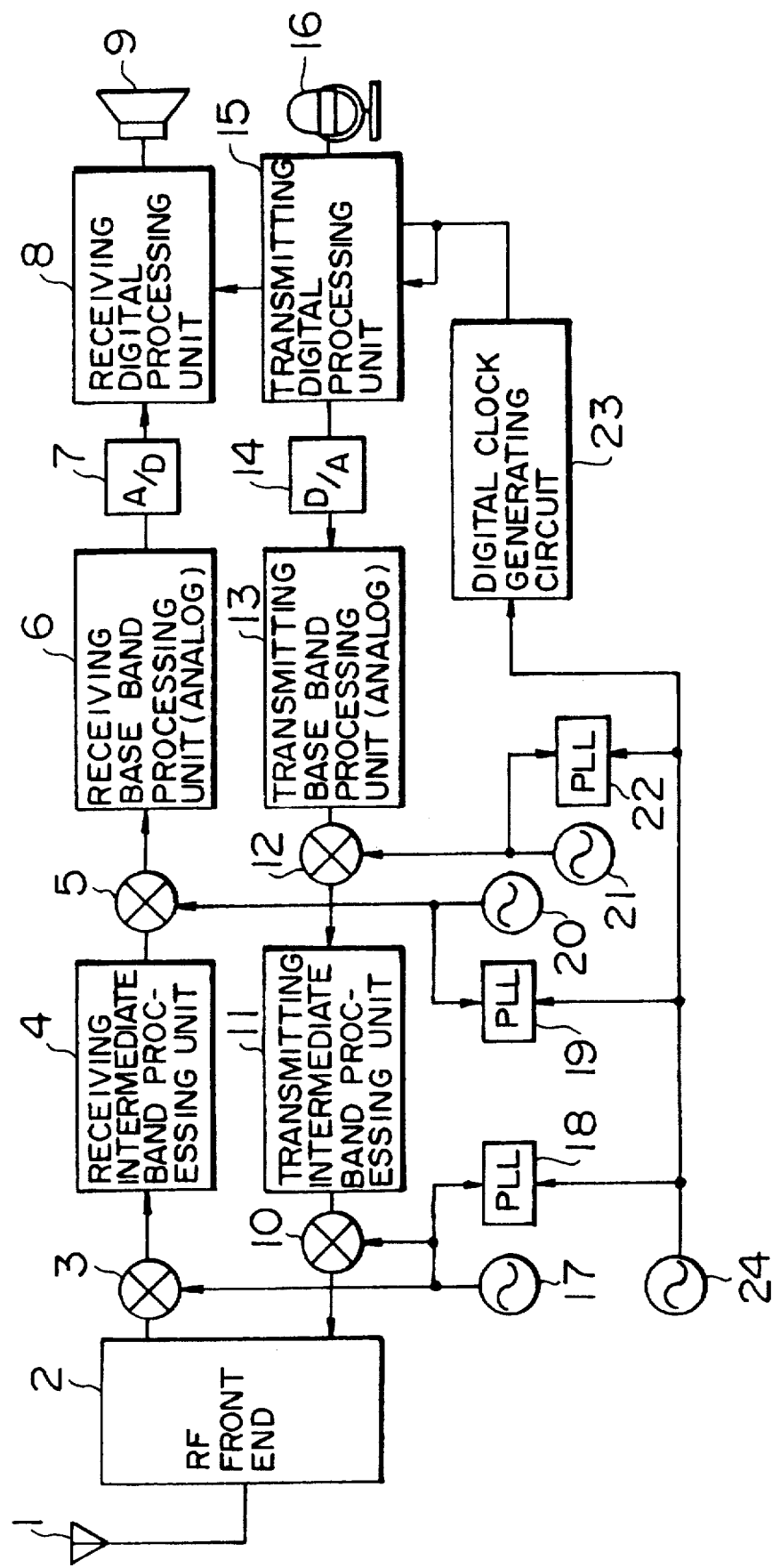
FIG. 1 is a block diagram showing the construction of a telephone terminal device which is an example of a system incorporating a frequency dividing circuit in accordance with the present invention.

Referring first to FIG. 1, a digital mobile telephone terminal, which incorporates a frequency dividing circuit of the present invention and which relies on a spread spectrum technique, has two systems: namely, a transmitting system and a receiving system which make a common use of an antenna 1.

The construction and operation of the receiving system are as follows. A signal received by the antenna 1 is supplied through an RF front end 2 to a receiving RF mixer 3 so as to be frequency-modulated, at the frequency of oscillation of an RF local oscillator 17, by the mixer 3 from the RF carrier wave frequency to an intermediate frequency band. The frequency-modulated signal is then subjected to intermediate frequency processing performed by a receiving intermediate band processing unit 4, followed by frequency conversion performed by a receiving intermediate band mixer 5, whereby a base band signal is formed. The base band signal thus formed is supplied to a receiving band processing unit 6 which performs base band processing on the base band signal, and thus processed signal is then supplied to an A/D converter 7 for A/D conversion. The digital received signal thus obtained is supplied to the receiving digital processing unit 8 which performs spectral inverse spreading, decoding and D/A conversion, whereby the received signal is changed into a voice signal which is output through a voice output device 9.

Referring now to the transmitting system, a voice signal which is input through a voice signal input 16 is supplied to a digital processing unit 15 which performs A/D conversion, encoding and spectral spreading. The spectral-spread digital signal thus obtained is sent to a D/A converter 14 so as to be converted into an analog signal which is base-band-processed by a transmitting base band processing unit 13. The signal thus processed is then supplied to a transmitting intermediate band processing unit 11 for intermediate-frequency processing and is then supplied to a transmitting RF mixer 10 which performs frequency conversion at the oscillation frequency of the RF local oscillator 17 into an RF carrier wave frequency. The signal is then sent through the front end 2 to the antenna 1 so as to be transmitted therefrom. The clock frequencies employed in the digital processings performed in the transmitting/receiving systems, including four types of digital processings, specifically, A/D conversion of the input signal and D/A conversion of the transmitting base band signal which are performed in the transmitting system, and A/D conversion of the receiving base band signal and D/A conversion into the output voice signal which are performed in the receiving system, are determined based on the spread clock frequency used in the frequency spreading processing.

Oscillation frequency of a base frequency oscillator 24 is used as the reference frequency for the operation of a PLL 18 in the RF local oscillator 17 and, hence, has to be an integral multiple of the channel spacing frequency on the carrier wave. It is therefore impossible to generate a digital clock frequency by dividing the base frequency into a submultiple, unless a suitable base frequency oscillator capable of oscillating a frequency which is a common multiple of the digital clock frequency and the channel spacing in the carrier wave is available. Where such a base frequency oscillator is unavailable, it is necessary to employ a frequency dividing circuit which has a fractional frequency dividing ratio.

For instance, assuming that the channel spacing is 130 KHz while the digital clock frequency is 9 MHz, the least common multiple frequency is as high as 117 MHz. Such a high frequency cannot suitably be used as the base frequency of a digital mobile telephone terminal, in view of restriction in size and power consumption. When 19.5 MHz, which is 150 times as high as the channel spacing frequency of 130 KHz, is used as the base frequency of a digital mobile telephone terminal, it is required to employ a frequency dividing circuit having a frequency dividing ratio of 6/13, in order to obtain the digital clock frequency of 9 MHz from this base frequency.

The present invention is aimed at providing a frequency dividing circuit having a fractional frequency dividing ratio which complies with the above-described requirement. A first embodiment of the present invention will be described with specific reference to FIG. 2. Although the above-mentioned fractional frequency dividing ratio of 6/13 is specifically mentioned, it will be clear to those skilled in the art that this value of the ratio is only illustrative and the present invention can be embodied with various other values of the fractional frequency dividing ratio.

Figure 2:
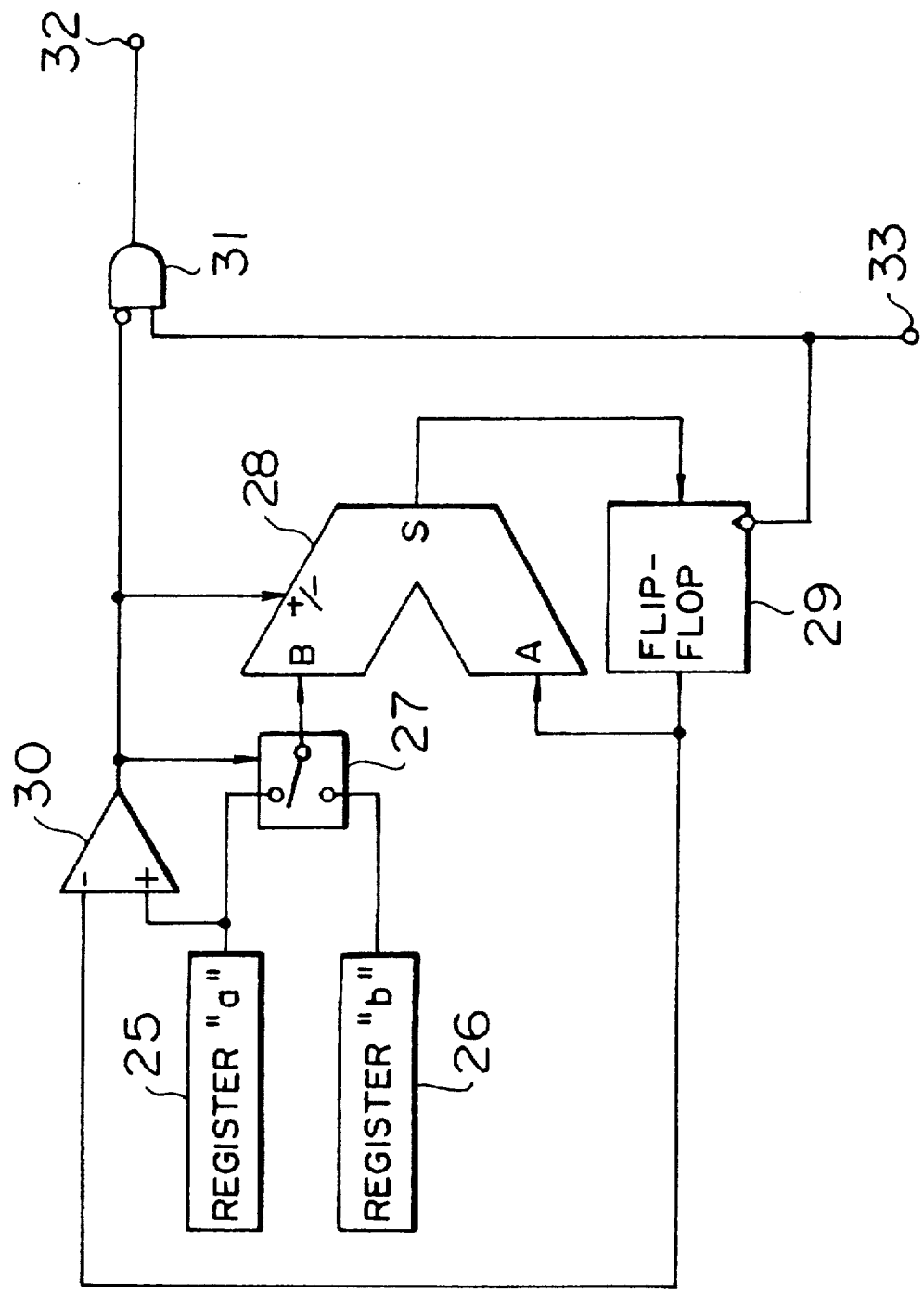
FIG. 2 is an illustration of a first embodiment of the frequency dividing circuit in accordance with the present invention.

Referring to FIG. 2, a frequency dividing circuit of the present invention has the following parts: a register "a" denoted by 25 for storing the difference between the denominator and the numerator of the fractional frequency dividing ratio; a register "b" denoted by 26 for storing the numerator of the fractional frequency dividing ratio; a selector 27 for selectively connecting one of the registers "a" 25 and "b" 26 to a computing unit 28 which also is a component of the frequency dividing circuit; a flip-flop 29 which picks up the output of the computing unit 28 at the timing of the signal to be frequency-divided; a comparator 30 for comparing the content of the register "a" 25 with the output value from the flip-flop 29; and a logical circuit 31 which receives both the output signal from the comparator 30 and the signal to be frequency-divided and computes AND of the received signals.

In operation of this frequency dividing circuit, the register "a" 25 stores the difference between the denominator and the numerator of the fractional frequency dividing ratio. In the illustrated case, the fractional frequency dividing ratio is 6/13, so that the above-mentioned difference is 7 as calculated by 13−6=7. Meanwhile, the numerator, i.e., 6, of the fractional frequency dividing ratio is stored in the register "b" 26. The flip-flop 29 operates at each fall of the base clock signal received by an input terminal 33 for receiving the signal to be frequency-divided, so as to store the output from the computing unit 28 and, at the same time, to deliver its content.

The comparator 30 compares the output from the register "a" 25 and the output from the flip-flop 29 with each other and produces as its output either "1" (true) or "0" (false), depending on the result of the comparison, in accordance with the following conditions.

When (content of register "a")>(output from flip-flop) is met, the output of the comparator 30 is "1" (true).

When (content of register "a")≦(output from flip-flop) is met, the output of the comparator 30 is "0" (false).

The selector 27 has two inputs: namely, an input for receiving the output of the register "a" 25 and an input for receiving the output from the register "b" 26 and operates to selectively connect one of these registers to an input B of the computing unit 28, in accordance with the following conditions.

When the output from the comparator 30 is true (1), the selector 27 selects the register "b" 26 and connects the same to the input B of the computing unit 28.

When the output from the comparator 30 is false (0), the selector 27 selects the register "a" 25 and connects the same to the input B of the computing unit 28.

Meanwhile, the other input A of the computing unit 28 receives the output from the flip-flop 29.

The computing unit computes and outputs (A+B) when the output from the comparator 30 is true (1), whereas, when the output from the comparator 30 is false (0), it computes and outputs (A−B).

The logical circuit 31 produces and outputs AND of the base clock signal and the inverse of the output of the comparator 30.

Figure 3:
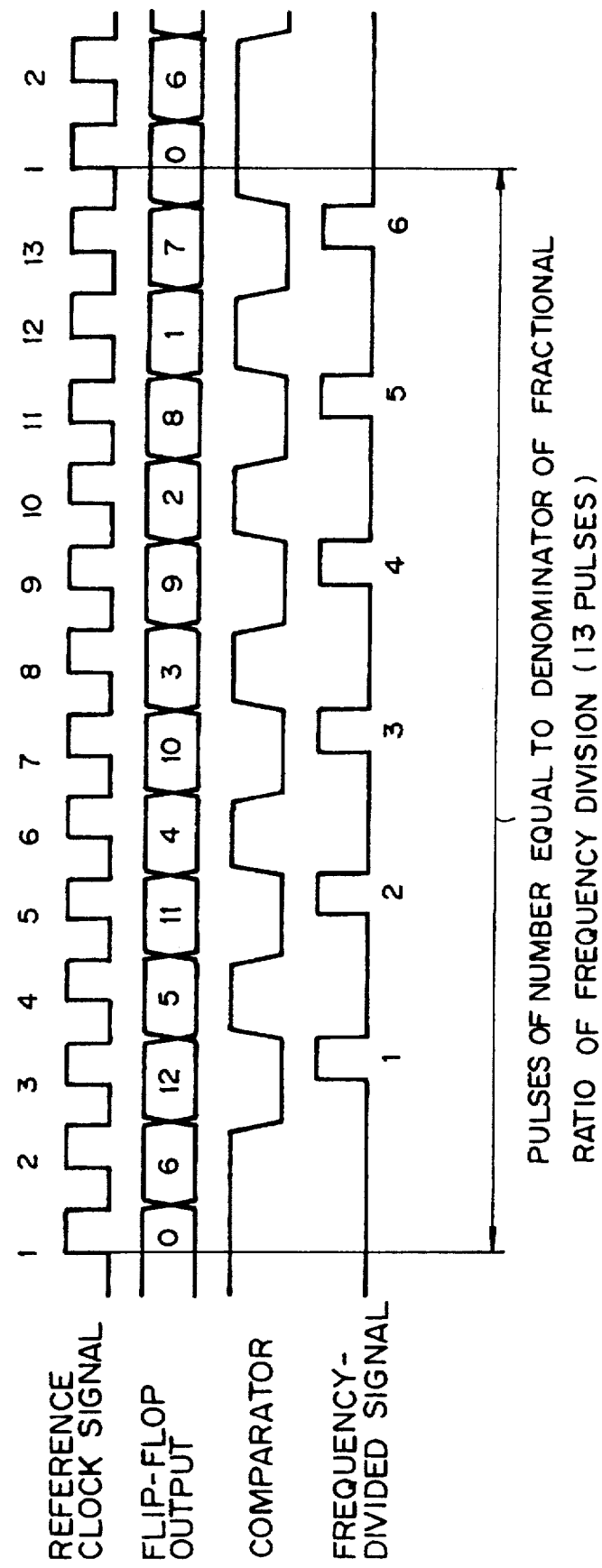
FIG. 3 is a timing chart showing the timing of operations of critical portions of the first embodiment.

The frequency-dividing process performed by this frequency dividing circuit will be described with reference to a timing chart in FIG. 3. When the first base clock pulse is input through the input terminal 33 for receiving the signal to be frequency-divided while the value held by the flip-flop 29 is the initial value "0", the comparator 30 produces and outputs "1" because the value "7" in the register "a" 25 is greater than "0" which is the value from the flip-flop 29. Since this value is input to the logical circuit 31 after inversion, no frequency-divided signal is produced in this case. In the meantime, the selector 27 selects the register "b" 26 and connects the same to the computing unit 28 so that the computing unit 28 computes (A+B), i.e., (0+6=6), and sets the value "6" in the flip-flop 29.

When the second base clock pulse is received, the value "7" of the register "a" 25 is still greater than the value "6" set in the flip-flop 29, so that the output from the comparator 30 remains to be "1". No frequency-divided signal is generated in this case. In the meantime, the selector 27 selects the register "b" 26 and connects the same to the computing unit 28 so that the computing unit 28 computes (A+B), i.e., (6+6=12), and sets the value "12" in the flip-flop 29.

When the third reference clock pulse is received, the output from the comparator 30 is changed to "0", since the value "7" held by the register "a" 25 is smaller than the value "12" which is held by the flip-flop 29. Since the inverse of this signal is supplied to the logical circuit 31, a frequency-divided signal is output from the logical circuit. At the same time, the selector 27 selects the register "a" 25 and connects the same to the computing unit 28 so that the computing unit 28 computes (A−B), i.e., (12 −7=5), and sets the value "5" in the flip-flop 29.

When the fourth pulse of the base clock signal is received, the comparator produces and outputs "1", since the value "7" of the register "a" 25 is greater than the value "5" held by the flip-flop 29, so that no frequency-divided signal is produced by the logical circuit 31. The selector 27 selects the register "b" 26 and connects the same to the computing unit 28 so that the computing unit 28 computes (A+B), i.e., (5+6=11), and sets the value "11" in the flip-flop 29.

The routine described above is repeated till the 13th base clock pulse is received, whereby one cycle of frequency dividing operation is completed. It will be seen that 6 pulses are delivered from the frequency-divided signal output terminal 32 in one cycle of operation. This means that the base clock signal has been frequency-divided into 6/13. According to this circuit arrangement, frequency division can be conducted at any desired fractional frequency-dividing ratio through the operation heretofore described.

Figure 4:
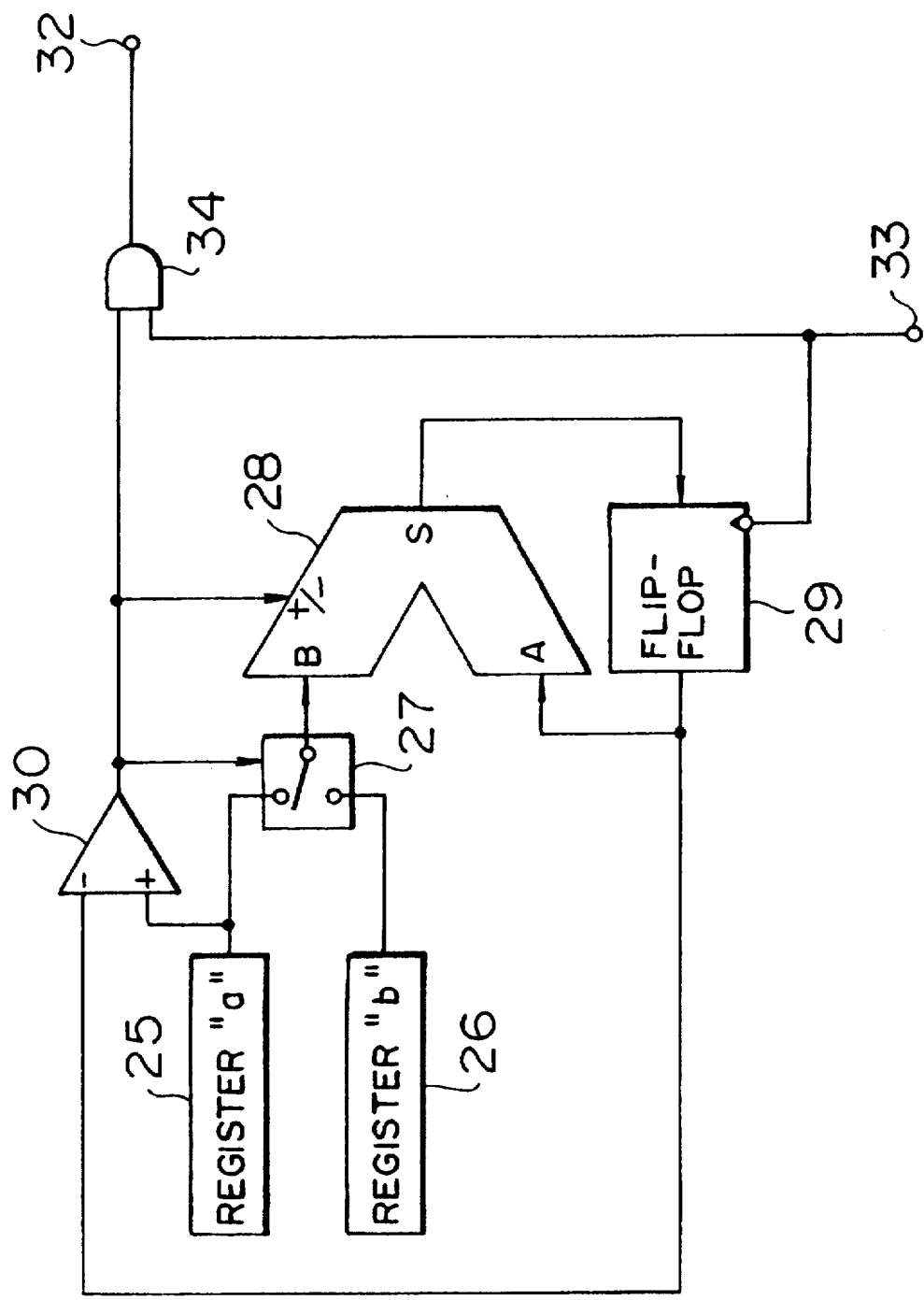
FIG. 4 is an illustration of a second embodiment of the frequency dividing circuit in accordance with the present invention.

A second embodiment of the present invention will be described with specific reference to FIG. 4. The second embodiment is different from the first embodiment shown in FIG. 2 in that it employs a non-inversion input logical circuit 34 in place of the inversion input logical circuit 31 used in the first embodiment and in that the registers "a" 25 and the register "b" 26 respectively store the numerator of the fractional frequency dividing ratio and the difference between the denominator and the numerator of this ratio. Other portions of the second embodiment are substantially the same as those of the first embodiment, so that no further description will be needed as to the detail of the second embodiment.

Figure 5:
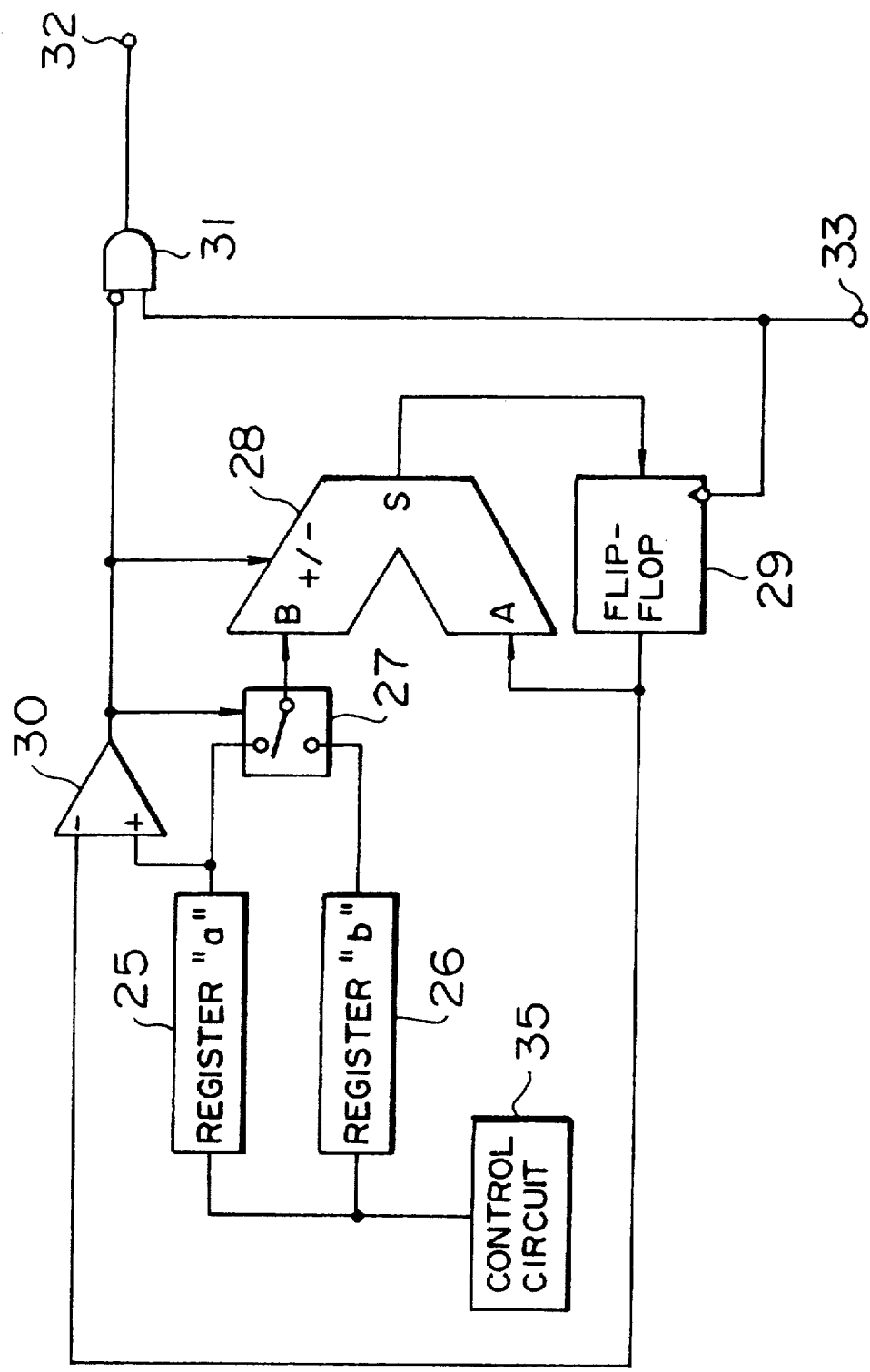
FIG. 5 is an illustration of a third embodiment of the frequency dividing circuit in accordance with the present invention.
Figure 6:
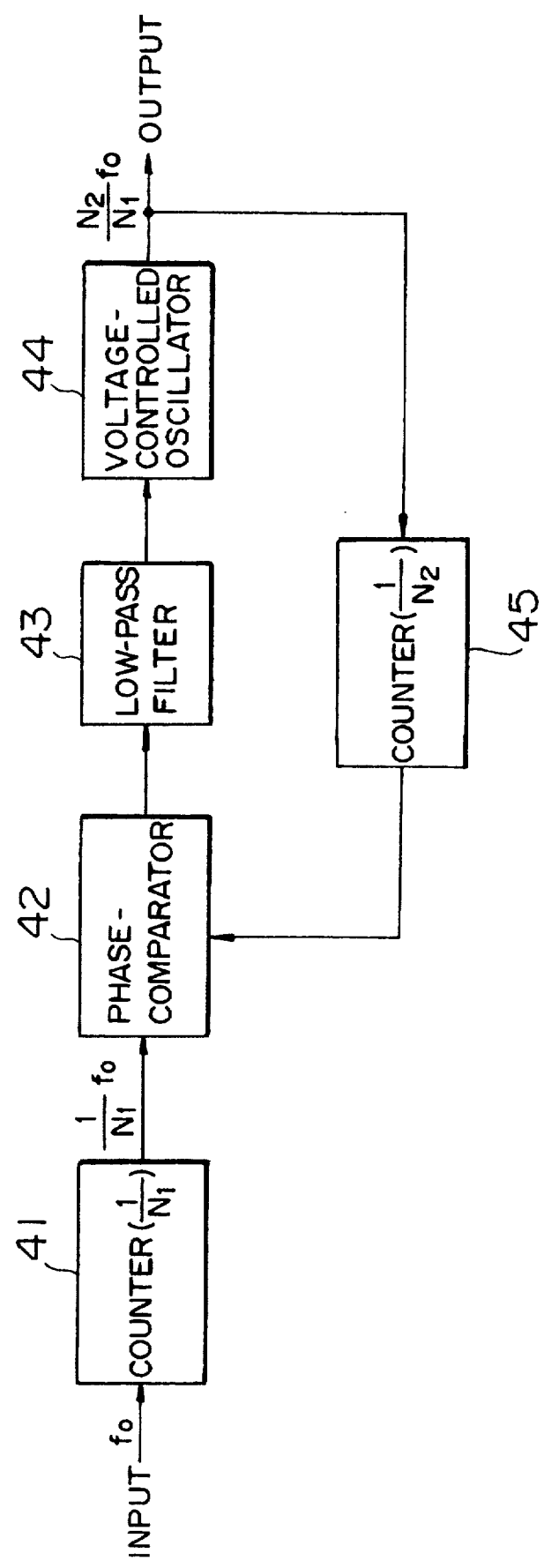
FIG. 6 is a block diagram showing the construction of a conventional frequency dividing circuit.

FIG. 5 shows a third embodiment of the present invention. The third embodiment features a control circuit 35 which controls the register "a" 25 and the register "b" 26 of the frequency dividing circuit of the first embodiment, so as to enable the values set in the register "a" 25 and the register "b" 26 to be changed as desired. This arrangement makes it possible to freely set the frequency dividing ratio by an external operation, thus adapting the frequency dividing circuit to wider use. Other portions of the third embodiment are materially the same as those of the first embodiment, and detailed description is omitted in regard to such portions.

Although three preferred embodiments have been described, it will be clear to those skilled in the art that these embodiments are only illustrative and various other types of circuits can be formed in accordance with the spirit of the present invention and such circuits also fall within the scope of the present invention.

As will be understood from the foregoing description, the frequency dividing circuit in accordance with the present invention can be constructed by using only digital circuits and, therefore, can easily be produced in the form of an IC, as compared with conventional frequency dividing circuits which employ PLL circuits. As a consequence, the present invention offers advantages such as reduction in the size of the circuit, increase in response, speed and reduction in power consumption, over the known frequency dividing circuits of the type which rely upon PLL technique.

The frequency dividing circuit of the present invention can be realized in a smaller scale even when compared with the known frequency dividing circuits of the type which employs a combination of a counter with a logical circuit or a storage device. The frequency dividing circuit of the present invention, therefore, advantageously reduces chip installation area when formed as an IC chip, while saving electrical power.

What is claimed is:

1. A frequency dividing circuit for effecting frequency division on a base signal at a fractional frequency dividing ratio, comprising:

a base signal input terminal for receiving said base signal;

a memory device connected to said base signal input terminal and operative in synchronization with said base signal to store a computed binary value of said base signal;

a first register for storing a value of a numerator of said fractional frequency dividing ratio;

a second register for storing a difference value between values of a denominator and the numerator of said fractional frequency dividing ratio;

comparator means for comparing an output from said memory device and a value stored in said second register;

switching means for selecting one of said first and second registers in accordance with a comparison output from said comparator means and for outputting the selected value;

computing means receiving the selected value from said switching means and the output from said memory device for performing one of an adding operation and a subtracting operation to determine a sum of or a difference between the received selected value and output from said memory device in accordance with the comparison output from said comparator means and for producing the computed binary value fed to said memory device; and a logical circuit for receiving said base signal received at said base signal input terminal and an inverse of the output from said comparator means and producing therefrom a frequency-divided output.

2. The frequency dividing circuit according to claim 1, further comprising a control circuit for changing the values respectively stored in said first and second registers.

3. The frequency dividing circuit according to claim 2, further comprising means for setting a frequency dividing ratio obtained by said control circuit changing the values respectively stored in said first and second registers.

4. A frequency dividing circuit for effecting frequency division on a base signal at a fractional frequency dividing ratio, comprising:

a base signal input receiving said base signal;

a memory device connected to said base signal input and operative in synchronization with said base signal to store a computed binary value of said base signal;

a first register for storing a value of a numerator of said fractional frequency dividing ratio;

a second register for storing a difference between values of a denominator and the numerator of said fractional frequency dividing ratio;

comparator means for comparing an output from said memory device and the value stored in said first register;

switching means for selecting one of said first and second registers in accordance with a comparison output from said comparator means and for outputting the selected value;

computing means receiving the selected value from said switching means and the output from said memory device for performing one of an adding operation and a subtracting operation to determine a sum of or a difference between the received selected value and the output from said memory device in accordance with the comparison output from said comparator means and for producing the computed binary value fed to said memory device; and a logical circuit for receiving said base signal from said base signal input and an output from said comparator means and producing the frequency-divided output.

5. The frequency dividing circuit according to claim 4, further comprising a control circuit for changing the values respectively stored in said first and second registers.

6. The frequency dividing circuit according to claim 5, further comprising means for setting a frequency dividing ratio obtained by said control circuit changing the values respectively stored in said first and second registers.

7. A telephone terminal device, comprising:

a receiving system including a receiving digital processing unit for performing A/D conversion of a received base band signal and for performing D/A conversion of the received base band signal into an output voice signal;

a transmitting system including a transmitting digital processing unit for performing A/D conversion of an input voice signal and D/A conversion of the input voice signal into a transmission base band signal; and frequency dividing means for conducting frequency division of a base signal frequency at a fractional frequency dividing ratio into an integral submultiple of said base signal frequency, thereby producing a clock frequency to be used in at least one of said digital processing section, said frequency dividing means including:

a base signal input for receiving said base signal;

a memory device connected to said base signal input and operative in synchronization with said base signal to store a computed binary value of said base signal;

a first register for storing a value of a numerator of said fractional frequency dividing ratio;

a second register for storing a difference between values of a denominator and the numerator of said fractional frequency dividing ratio;

comparator means for comparing an output from said memory device and a value stored in said second register;

switching means for selecting one of said first and second registers in accordance with a comparison output from said comparator means and for outputting the selected value;

computing means receiving the selected value from said switching means and the output from said memory device for performing one of an adding operation and a subtracting operation to determine a sum of or a difference between the received selected value and the output from said memory device in accordance with the comparison output from said comparator means and for producing the computed binary value fed to said memory device; and a logical circuit for receiving said base signal from said base signal input and an inverse of the output from said comparator means and producing therefrom a frequency-divided output.

8. A telephone terminal device, comprising:

a receiving system including a receiving digital processing unit for performing A/D conversion of a received base band signal and for performing D/A conversion of the received base band signal into an output voice signal;

a transmitting system including a transmitting digital processing unit for performing A/D conversion of an input voice signal and D/A conversion of the input voice signal into a transmission base band signal; and frequency dividing means for conducting frequency division of a base signal frequency at a fractional frequency dividing ratio into an integral submultiple of said base signal frequency, thereby producing a clock frequency to be used in at least one of said digital processing section, said frequency dividing means including:

a base signal input for receiving said base signal;

a memory device connected to said base signal input and operative in synchronization with said base signal to store a computed binary value of said base signal;

a first register for storing a value of a numerator of said fractional frequency dividing ratio;

a second register for storing a difference between a values of the denominator and the numerator of said fractional frequency dividing ratio;

comparator means for comparing an output from said memory device and a value stored in said first register;

switching means for selecting one of said first and second registers in accordance with a comparison output from said comparator means and for outputting the selected value;

computing means receiving the selected value from said switching means and the output from said memory device for performing one of an adding operation and a subtracting operation to determine a sum of or a difference between the received selected value and the output from said memory device in accordance with the comparison output from said comparator means and for producing the computed binary value fed to said memory device; and a logical circuit for receiving said base signal from said base signal input and an output from said comparator means and producing therefrom a frequency-divided output.

9. A frequency dividing method for effecting frequency division on a base signal at a fractional frequency dividing ratio, comprising the steps of:

inputting a base signal through a base signal input;

storing in a memory device a computed binary value of the input base signal in synchronization with said base signal;

storing in a first register a value of a numerator of said fractional frequency dividing ratio;

storing in a second register a difference between a value of a denominator and the value of the numerator of said fractional frequency dividing ratio;

comparing an output from said memory device and a value stored in said second register;

selecting one of said first and second registers in accordance with a result of the comparing step and outputting the value from the selected register;

performing, upon receiving the selected value from said selecting step and an output from said memory device, one of an adding operation and a subtracting operation to determine a sum of or a difference between the received selected value and the output from said memory device in accordance with the output from said comparing step and for delivering a result of the adding or subtracting operation as said computed binary value to said memory device; and conducting a logical computation on said base signal and the inverse of the result from said comparing step, thereby producing a frequency-divided output.

10. The frequency dividing method according to claim 9, further comprising the step of changing the values stored in said first and second registers.

11. The frequency dividing method according to claim 10, further comprising the steps of setting a frequency dividing ratio obtained through changing the values stored in said first and second registers.

12. A frequency dividing method for effecting frequency division on a base signal at a fractional frequency dividing ratio, comprising the steps of:

inputting a base signal through a base signal input;

storing in a memory device a computed binary value of the input base signal in synchronization with said base signal;

storing in a first register a value of a numerator of said fractional frequency dividing ratio;

storing in a second register a difference between a value of a denominator and the value of the numerator of said fractional frequency dividing ratio;

comparing an output from said memory device and a value stored in said first register;

selecting one of said first and second registers in accordance with a result of the comparing step and outputting the value from the selected register;

performing, upon receiving the selected value from said selecting step and an output from said memory device, one of an adding operation and a subtracting operation to determine a sum of or a difference between the received selected value and the output from said memory device in accordance with the output from said comparing step and for delivering a result of the adding or subtracting operation as said computed binary value to said memory device; and conducting a logical computation on said base signal and the result from said comparing step thereby producing a frequency-divided output.

13. The frequency dividing method according to claim 12, further comprising the step of changing the values stored in said first and second registers.

14. The frequency dividing method according to claim 13, further comprising the steps of setting a frequency dividing ratio obtained through changing the values stored in said first and second registers.

* * * * *